United States Patent
Moruzzi

(10) Patent No.: US 9,568,257 B2
(45) Date of Patent: Feb. 14, 2017

(54) THERMAL TRANSFER DEVICE WITH SPIRAL FLUID PATHWAYS

(75) Inventor: Marco Moruzzi, Vergato (IT)

(73) Assignee: Aavid Thermalloy, LLC, Laconia, NH (US)

( * ) Notice: Subject to any disclaimer, the term of this patent is extended or adjusted under 35 U.S.C. 154(b) by 133 days.

(21) Appl. No.: 14/003,511

(22) PCT Filed: Mar. 7, 2011

(86) PCT No.: PCT/US2011/027352
§ 371 (c)(1),
(2), (4) Date: Oct. 8, 2013

(87) PCT Pub. No.: WO2012/121696
PCT Pub. Date: Sep. 13, 2012

(65) Prior Publication Data
US 2014/0020867 A1 Jan. 23, 2014

(51) Int. Cl.
*F28F 1/00* (2006.01)
*F28D 7/02* (2006.01)
(Continued)

(52) U.S. Cl.
CPC ............ *F28F 1/00* (2013.01); *F28D 7/026* (2013.01); *F28D 9/0075* (2013.01); *F28F 1/36* (2013.01);
(Continued)

(58) Field of Classification Search
CPC .... H05K 7/20254; H01L 23/473; F28F 13/12; F28F 1/10; F28F 1/12; F28F 1/14; F28F 1/16; F28F 1/36; F28F 3/086; F28D 7/026
See application file for complete search history.

(56) References Cited

U.S. PATENT DOCUMENTS

| | | | | |
|---|---|---|---|---|
| 1,673,918 A | * | 6/1928 | Mauran | F28D 7/026 122/183 |
| 3,566,615 A | * | 3/1971 | Roeder, Jr. | F28D 7/026 165/156 |
| 4,226,281 A | * | 10/1980 | Chu | 165/80.2 |
| 4,351,389 A | | 9/1982 | Guarnaschelli | |
| 4,823,865 A | * | 4/1989 | Hughes | 165/109.1 |
| 5,166,863 A | * | 11/1992 | Shmunis | 361/699 |
| 5,177,667 A | * | 1/1993 | Graham et al. | 361/715 |
| 5,228,502 A | | 7/1993 | Chu et al. | |
| 5,454,429 A | * | 10/1995 | Neurauter | 165/109.1 |
| 7,849,914 B2 | | 12/2010 | Di Stefano et al. | |
| 2003/0152488 A1 | * | 8/2003 | Tonkovich et al. | 422/99 |
| 2005/0061495 A1 | * | 3/2005 | Schubert | F28D 7/026 165/177 |

(Continued)

FOREIGN PATENT DOCUMENTS

| | | |
|---|---|---|
| DE | 8804742 U1 | 6/1988 |
| DE | 19747321 A1 | 5/1999 |
| JP | H08215737 A | 8/1996 |

OTHER PUBLICATIONS

Supplementary European Search Report from European Application No. EP 11 86 0308 dated Jan. 30, 2015.
201180070660.1, Apr. 3, 2015, First Office Action.

*Primary Examiner* — Frantz Jules
*Assistant Examiner* — Nelson Nieves
(74) *Attorney, Agent, or Firm* — Wolf, Greenfield & Sacks, P.C.

(57) ABSTRACT

A thermal transfer device comprising a thermal transfer surface and a passageway for conducting a thermal transfer fluid from an inlet to an outlet while passing in thermal contact with the thermal transfer surface. The passageway has at least two spiral passages and a connection channel connecting the at least two spiral passages to permit flow of the heat transfer fluid from a first spiral passage to a second spiral passage; thereby forming a path for the flow of the thermal fluid from the inlet, through the passageway, along the first spiral passage to the connection channel, then along the connection channel to the second spiral passage, and then to the outlet.

23 Claims, 4 Drawing Sheets

(51) Int. Cl.
  *F28D 9/00*   (2006.01)
  *F28F 3/06*   (2006.01)
  *F28F 13/12*  (2006.01)
  *F28F 1/40*   (2006.01)
  *F28F 3/08*   (2006.01)
  *F28F 1/36*   (2006.01)
  *H01L 23/473* (2006.01)
  *H05K 7/20*   (2006.01)
  *F28D 21/00*  (2006.01)

(52) U.S. Cl.
  CPC . *F28F 1/40* (2013.01); *F28F 3/06* (2013.01); *F28F 3/086* (2013.01); *F28F 13/12* (2013.01); *H01L 23/473* (2013.01); *H05K 7/20254* (2013.01); *F28D 2021/0029* (2013.01); *H01L 2924/0002* (2013.01)

(56) References Cited

U.S. PATENT DOCUMENTS

| | | | |
|---|---|---|---|
| 2005/0143000 A1* | 6/2005 | Eisele et al. | 454/184 |
| 2005/0189342 A1* | 9/2005 | Kabbani | 219/494 |
| 2006/0260789 A1 | 11/2006 | Nakagawa et al. | |
| 2007/0163765 A1* | 7/2007 | Rondier et al. | 165/153 |
| 2007/0246204 A1* | 10/2007 | Lai et al. | 165/166 |
| 2007/0256810 A1* | 11/2007 | Di Stefano et al. | 165/46 |
| 2008/0165500 A1* | 7/2008 | Yoshioka et al. | 361/699 |
| 2009/0301695 A1 | 12/2009 | Baker | |
| 2010/0315782 A1 | 12/2010 | Pautsch et al. | |

* cited by examiner

THERMAL TRANSFER DEVICE WITH SPIRAL FLUID PATHWAYS

BACKGROUND OF THE INVENTION

1. Field of the Invention

This invention is directed to a thermal transfer device, such as a cold plate for use in indirectly cooling objects with a cooling liquid and, more particularly, to a thermal transfer device having spiral fluid pathways for efficiently conducting a cooling fluid into indirect thermal contact with an object to be cooled.

2. Description of the Related Art

Cold plates are well-known thermal transfer devices used for cooling objects that generate excessive heat, such as, without limitation, computer chips. Cold plates are generally placed into thermal contact with the object to be cooled, and pass a cooling liquid over a surface which separates the liquid from the actual object to be cooled. In this fashion, heat may be transferred between the fluid and the object, without the fluid ever coming into direct contact with the object.

Direct contact is generally avoided, because the properties of many cooling fluids may be deleterious to the object to be cooled, or toxic to the environment, so it is preferred that the fluid be contained within a sealed environment. At the very least, it is preferred that the cooling fluid be re-circulated for efficiency and economy.

To improve the efficiency of heat transfer, it is widely known to maximize the amount of surface area of the heat transfer surfaces that comes in contact with the heat transfer fluid. There is a limit, however, as to how this has been accomplished to date. For example, it is common to form the heat transfer surface which comes into contact with the heat transfer fluid with protrusions, such as fins, to increase the amount of surface area which interfaces with the heat transfer fluid. The addition of fins, however has the unwanted effect of interfering with the flow of the thermal transfer fluid, thereby lowering the rate of thermal transfer and impairing the overall efficiency of the thermal transfer device.

Although cold plates are generally well known and widely used, there is a continuing need to make cold plates more efficient, and, therefore, more competitive, cost-effective and useful. It is especially useful to provide a single cold plate that can be used for cooling two objects at the same time, such as two computer chips operating in a computer without having to install two separate cold plates.

It will also be appreciated by one of ordinary skill in the art that a "cold plate" can be used to heat an object, if the application calls for it, so that the heat transfer fluid is at a higher temperature than the object to be warmed. For ease of reference, however, thermal transfer devices may be called herein "cold plates" even though the same structure, in a different application, may in fact be used to heat an object.

SUMMARY OF THE INVENTION

It is therefore an object of the invention to provide a thermal transfer device which provides efficient and effective cooling of objects which may tend to overheat, such as computer chips.

It is a further object of the invention to provide an improved thermal transfer device having a plurality of spiral passages to increase the effective surface area exposed to a heat transfer fluid for cooling an object, and to thereby render the heat transfer device more efficient.

In accordance with these and other objects of the invention there is provided a thermal transfer system which includes a thermal transfer surface and a passageway for routing a heat transfer fluid from an inlet to an outlet while passing in thermal contact with the thermal transfer surface. The passageway has at least two spiral or helical passages and a connection channel connecting the at least two spiral passages to permit flow of the heat transfer fluid from a first spiral passage to a second spiral passage; thereby forming a path for the flow of the thermal fluid from the inlet, through the passageway, along the first spiral passage to the connection channel, then along the connection channel to the second spiral passage, and then to the passageway and to the outlet. This structure will provide a lengthened flow path of increased surface area for the heat transfer fluid and thereby provide more cooling to the heat transfer surface. The terms "helical" and "spiral" are used interchangeably herein.

Suitable heat transfer fluids are well known in the art and may include, for example, water, deionized water, a mixture of water and ethylene glycol, propylene glycol, dielectric cooling fluids, and petroleum-based cooling fluids.

In accordance with the preferred embodiments the invention may be used to cool high power devices such as thyristors, diodes and high-power computer chips.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

For a further description of the invention, reference is made to the exemplary embodiments shown in the drawings, in which like numerals refer to like parts.

DETAILED DESCRIPTION OF THE PRESENTLY PREFERRED EMBODIMENTS

Figure 1:
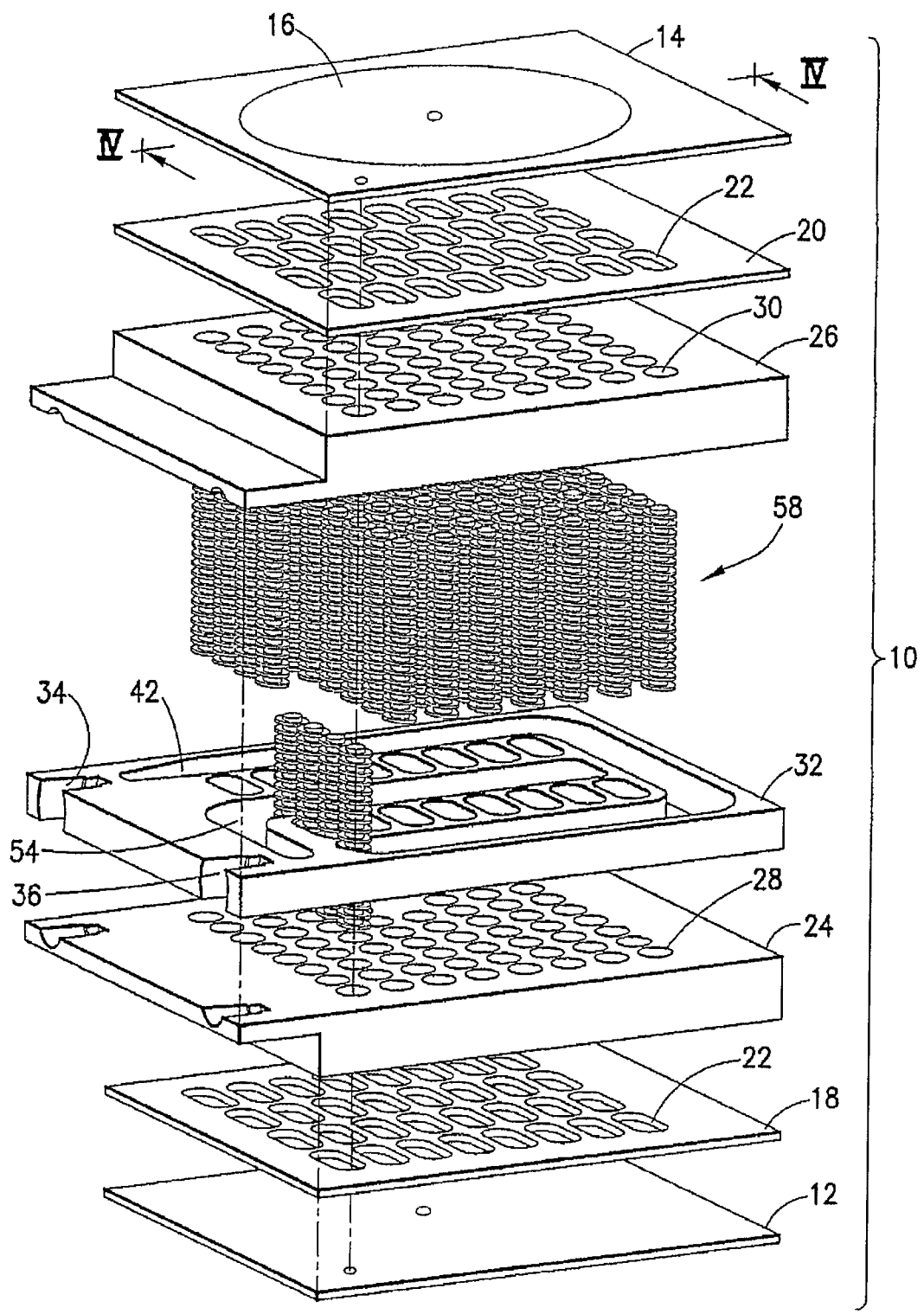
FIG. 1 is an exploded perspective view showing the various elements of the inventive thermal transfer device.

In accordance with a preferred embodiment of the invention, there is shown, generally at 10, a thermal transfer device, or "cold plate" in accordance with the invention. Thermal transfer device 10 includes a pair of opposed thermal transfer surfaces 12, 14. Thermal transfer surfaces 12, 14 are made of a suitable thermal transfer material, such as, copper, aluminum and alloys of steel. Thermal transfer surfaces 12, 14 are preferably generally planar and form the outer surfaces through which heat transfer activity takes place. Each thermal transfer surface 12, 14 contacts an object to be cooled, such as shown (diagrammatically) with respect to the outer surface of heat transfer surface 14 by circle 16. Although preferably generally planar, to provide the widest possible utility of thermal transfer device 10, thermal transfer surfaces 12, 14 may be formed in any desired shape, such as to conform to the shape of a specific object to be cooled. In the preferred embodiment, where the object to be cooled is a computer chip (not shown), a planar configuration is acceptable.

For ease of reference herein, the term "outer", when referring to the relative position of elements in thermal transfer device 10, means in the direction(s) towards the object(s) to be cooled, and "inner" means in the direction opposite thereto, so that the "outer" surface of heat transfer surface 12 is at the bottom of heat transfer device 10 and hidden from view in FIG. 1, while the "outer" surface of heat transfer surface 14 is visible at the top of FIG. 1.

Attached to the respective inner sides of thermal transfer surfaces 12, 14 are respective thermal conductive layers 18, 20. Thermal conductive layers 18, 20 are generally planar on their outer sides, which abut thermal transfer surfaces 12, 14, and contain connecting channels 22 therethrough. Thermal conductive layers 18 and 20 are preferably made of copper, aluminum or alloys of steel. The configuration of connecting channels 22 will be described below.

Attached to the respective inner sides of thermal conductive layers 18, 20 are respective support layers 24, 26 having respective first holes 28 and second holes 30 therein. Support layers 24, 26 are preferably made of copper, aluminum or alloys of steel.

Attached to the inner sides of both support layers 24, 26 is a central layer 32 having an inlet 34 for receiving a thermally conducting fluid (not shown) from a reservoir (also not shown) and an outlet 36 for returning the thermally conducting fluid to the reservoir. Central layer 32 is preferably made of copper, aluminum or alloys of steel but composite materials or plastic could be used for this component. Using a non-electrically conductive material such as a composite or plastic for this component could be advantageous in terms of material and manufacturing cost and would also serve to electrically isolate the fluid connections from the components being cooled or heated, should that be called for by the application. The construction of central layer 32 is best seen by reference to FIG. 2.

In one embodiment, portions of the inlet 34 and outlet 36 may also be formed in the support layers 24, 26. In such an embodiment, it will be appreciated that the fluid connections will no longer be electrically isolated from the components to be cooled, particularly because layers 24 and 26 may be comprised of metal.

Figure 2:
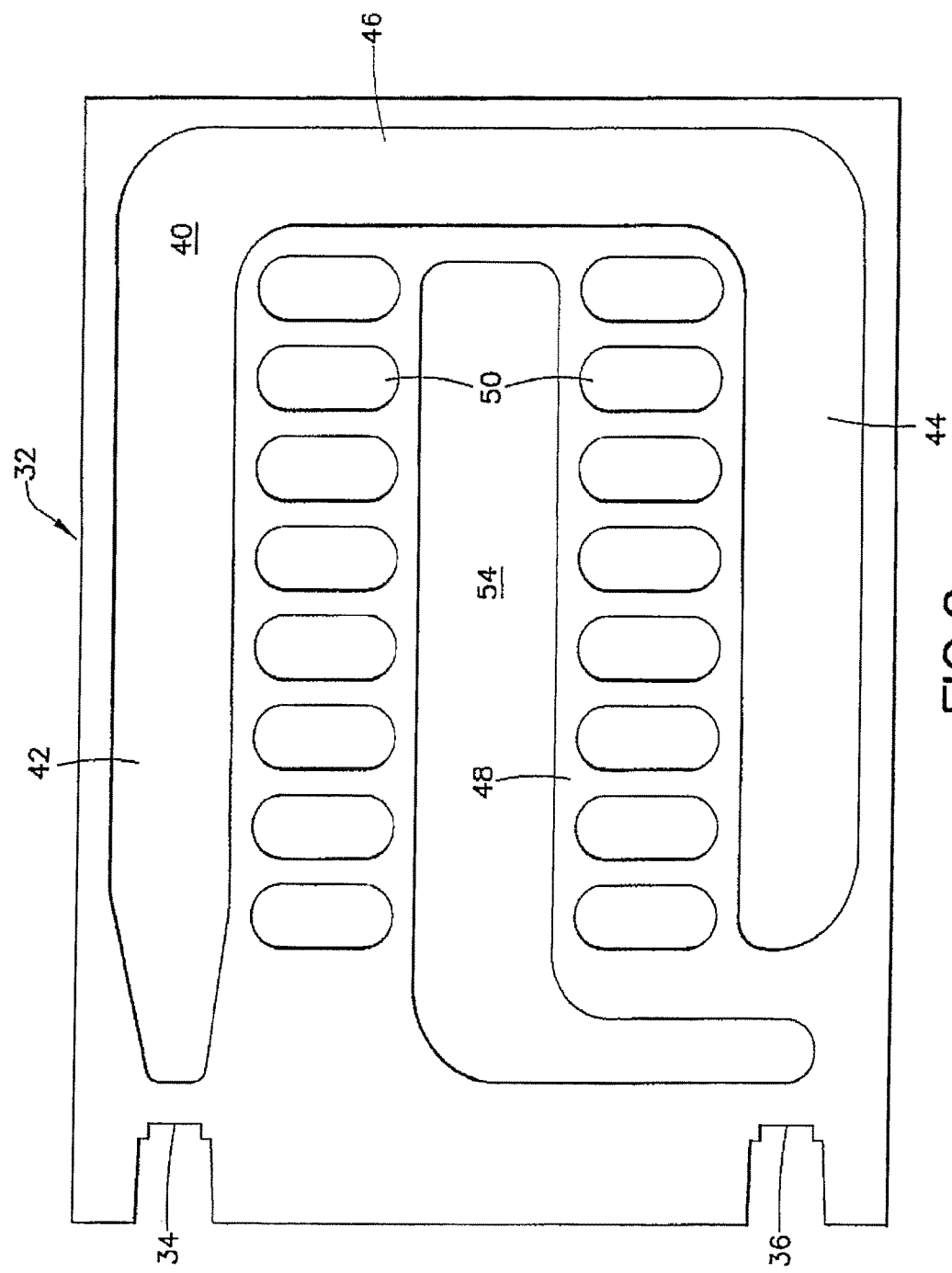
FIG. 2 is a top plan view of a central layer of the embodiment of the inventive thermal transfer device shown in FIG. 1.
Figure 3:
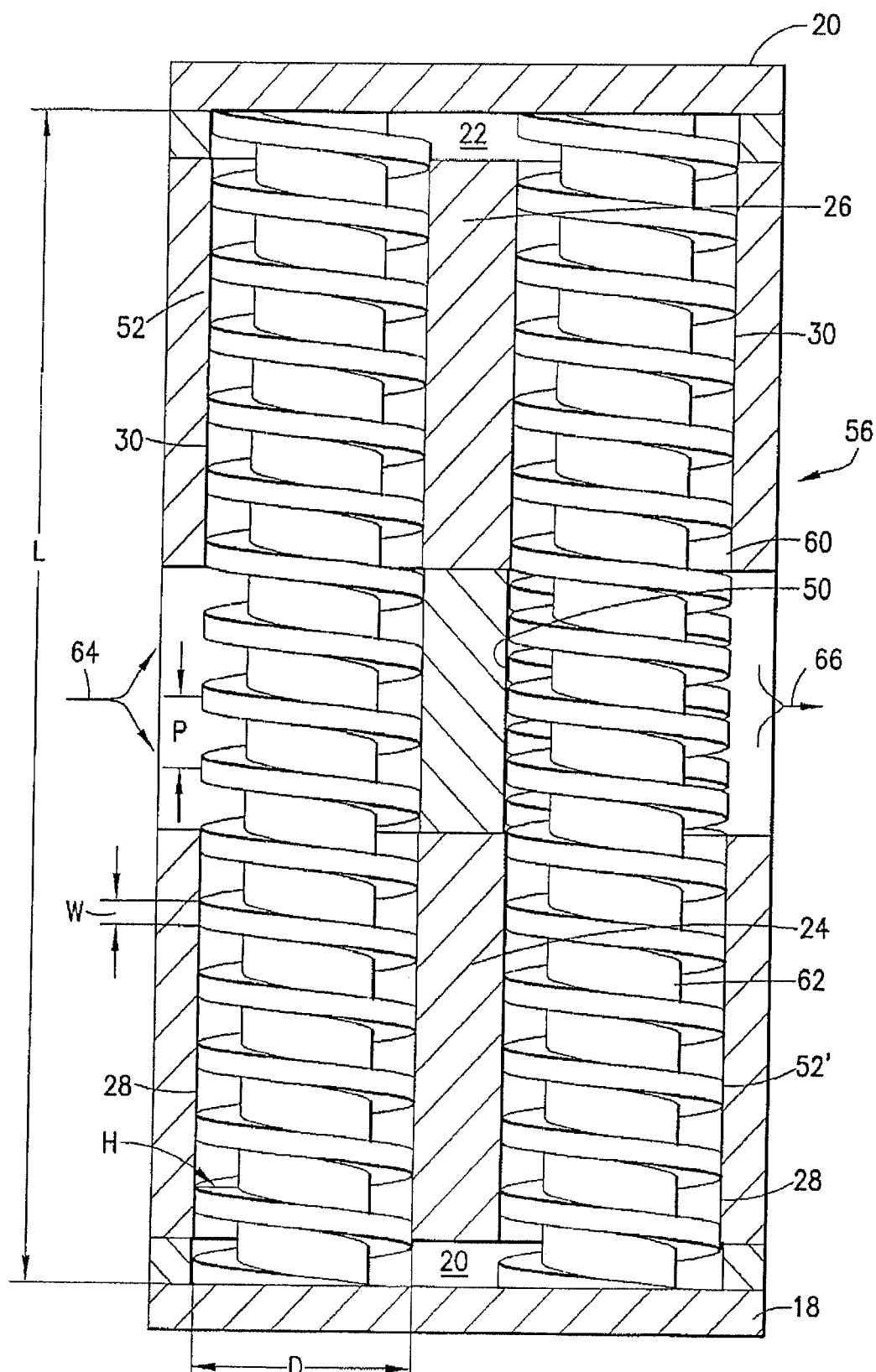
FIG. 3 is a detail of a pair of adjacent grooved rods used to form spiral passages for the flow of a thermal transfer fluid in a thermal transfer device such as depicted in FIG. 1.

As seen in FIG. 2, central layer 32 has a generally "U"-shaped open channel 40, having a first leg 42 and a second leg 44 joined by a channel 46. Two lands 48 are positioned on the interior sides of legs 42 and 44 and have slots 50 therein. Slots 50 are positioned in lands 48 so that ends of slots 50 align with respective ones of holes 28 in support layer 24 and holes 30 in support layer 26, thereby forming contiguous generally cylindrical chambers 52 when thermal device 10 is assembled (FIG. 3).

Lands 48 are separated by an open channel 54 leading to outlet 36.

The components thus far described are assembled together as layers in a sandwich, by any convenient means, such as screws, brazing, welding or adhesive bonding. It is important to note that the completed thermal transfer device is preferably tightly assembled so that there is no leakage of the thermal transfer fluid during use for reasons previously described. In the preferred embodiment, the components of thermal transfer device 10 are connected by brazing.

It will also be appreciated by one of ordinary skill in the art that thermal transfer device 10 has two halves, an upper half and a lower half, that are essentially mirror images of one another.

In addition to the various layers already described, thermal transfer device 10 further includes a plurality of grooved rods 58. Grooved rods 58 may be formed of any suitable thermally conductive material, and are formed as screws or bolts, but are preferably formed as rods made of copper having a helical groove or threading on their outer cylindrical surface.

Turning now to FIG. 3, grooved rods 58 have a length L and a single spiral threading or groove 60 surrounding a generally cylindrical central post 62. Grooved rods 58 have a diameter D and the groove or thread has a width W, height H and pitch P as shown. The rods 58 are dimensioned to extend between connecting channels 22 in thermally conductive layer 18 along chambers 52 to connecting channels 22 in thermally conducting layer 20. It is preferred that the tolerances of grooved rods 58 be such that they fit sufficiently snugly within chambers 52 and that there is little to no room for thermally conductive fluid to leak between adjacent parts of groove 60. This arrangement provides the thermal transfer fluid which contacts grooved rods 58 to be forced to travel up or down the length of spiral groove 60 as shown by double headed arrow 64, and thence along connecting channels 20, 22 to an adjacent grooved rod 58 where the direction is reversed and the thermal transfer fluid may leave the adjacent chamber 52' as shown by arrow 66. This construction therefore forms a substantially contiguous and uninterrupted passageway for the flow of thermal transfer fluid within thermal transfer device 10.

The dimension of the diameter D of the grooved rods 58 can reasonably vary from between 3 mm to 20 mm; the height H can vary from between 0.5 mm to 8 mm, the width W can vary from between 0.5 mm to 5 mm and the pitch P can vary from between 1.5 mm to 9 mm. The following dimensions are for two presently-preferred embodiments;

D=10 mm, W=1 mm, P=3 mm, H=2 mm;
D=8 mm, W=1 mm, P=3 mm, H=2 mm.

It is also preferred that the length L be greater than double the value of the pitch P and lie within the following range $2D<L<10D$. Still other dimensions and arrangements can be readily employed to implement the desired heat dissipating properties of the device based on the intended application.

It will be appreciated that although helical grooves or threading is disclosed and described above, other thread form configurations such as trapezoidal, triangular, truncated, etc. can be used as is known in the art.

Figure 4:
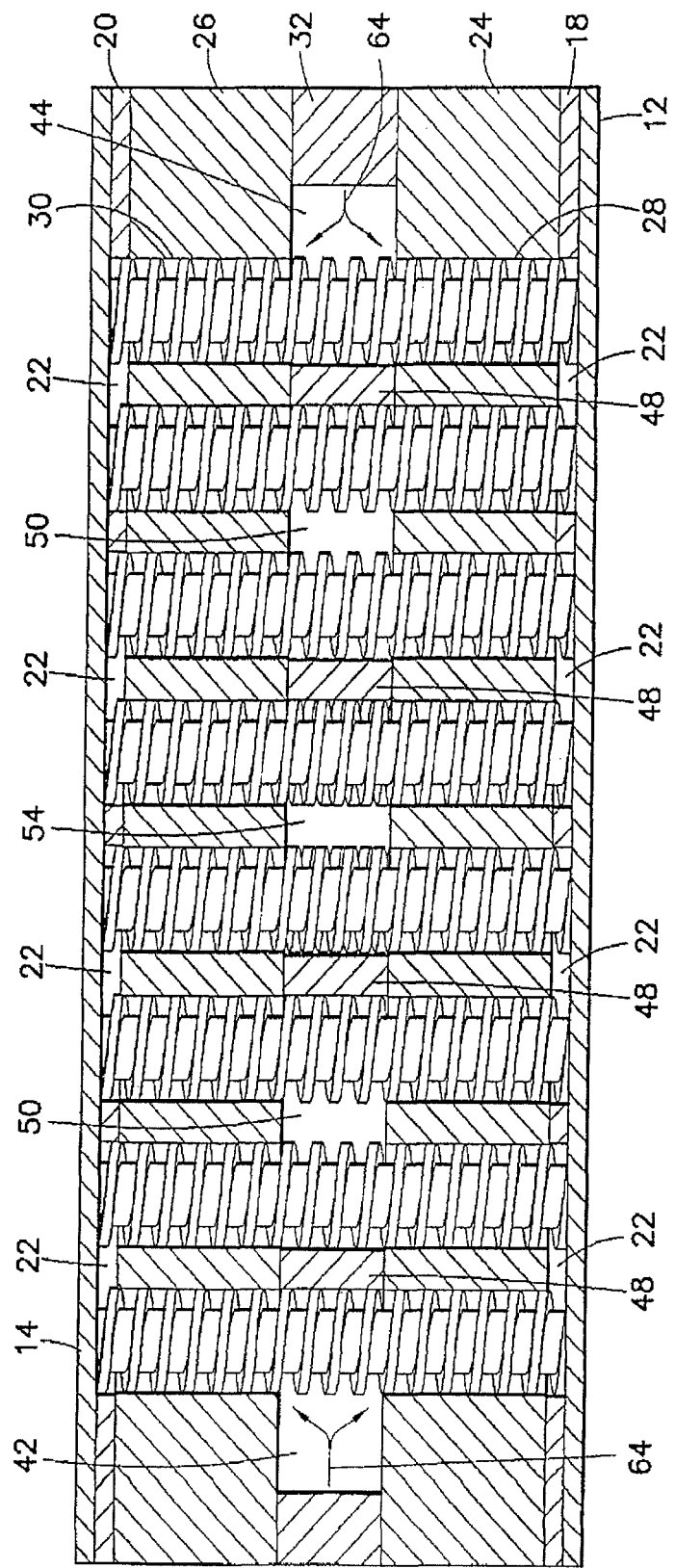
FIG. 4 is a cross-section of the inventive thermal transfer device shown in FIG. 1, taken generally along the line IV-IV thereof.

The path of fluid flow is shown in FIGS. 3 and 4 by arrows 64, 66.

Thermal transfer device 10 thus provides a convenient and more efficient way to transfer heat by use of a single essentially uninterrupted passageway, having multiple internal passages, for the flow of the thermal transfer fluid from inlet 34 to outlet 36 as shown in FIGS. 3 and 4. The thermal transfer fluid enters inlet 34 and flows along open channel 40. Constrained by the closed end of leg 44 (FIG. 2), fluid is forced into the available openings, namely holes 28 in support layer 24 and holes 30 in support layer 26. The fluid then flows into the spiral passages formed by the interaction of spiral grooves 60 and chambers 52. Since grooved rods 58 are transverse to the flow of thermally conductive fluid in the first leg 42 and second leg 44, the flow of fluid is now re-routed to follow the spiral passages already defined as illustrated by arrows 64.

The thermal transfer fluid will travel in an essentially serpentine pattern along (both up and down in FIGS. 3 and 4) grooved rods 58, along connecting channels 22 and along the adjacent grooved rods 52' (FIG. 3), where it will follow slots 50 to repeat the travel of going up and down grooved rods 58 until the thermal transfer fluid reaches central open channel 54 (FIG. 2) from whence it will exit thermal transfer device 10 through outlet 36.

The path of travel of the thermal transfer fluid is greatly lengthened by use of the defined spiral passages which provide greatly increased heat transfer surface area in contact with the thermal transfer fluid, thereby enhancing the overall efficiency of heat transfer device 10 when compared to the prior art.

It will be appreciated by one of ordinary skill in the art that thermal transfer surfaces 12, 14 could be formed integrally with the respective thermal conductive layer 18, 20 without departing from the scope or teaching of the invention herein, and that making those elements as single pieces or as two pieces is a mere matter of design choice.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements which perform substantially the same function in substantially the same way to achieve the same results are within the scope of the invention. Moreover, it should be recognized that structures and/or elements shown and/or described herein may be incorporated in any other disclosed or described or suggested form or embodiment as a general matter of design choice. It is the intention, therefore, to be limited only as indicated by the scope of the claims appended hereto.

What is claimed is:

1. A thermal transfer device comprising:
   a thermal transfer surface; and
   a passageway for conducting a thermal transfer fluid from an inlet to an outlet while the thermal transfer fluid passes in thermal contact with said thermal transfer surface;
   said passageway including first and second spiral passages and a connection channel connecting said first and second spiral passages to permit flow of said thermal transfer fluid from said first spiral passage to said second spiral passage;
   said first and second spiral passages bounded on an interior of the spirals thereof by respective first and second thermally conductive posts each having an end in thermally conductive contact with the thermal transfer surface and bounded on an exterior of the spirals thereof by a respective wall, the first and second spiral passages being bounded so that thermal transfer fluid is forced to flow along a length of the first and second spiral passages;
   said connection channel being bounded to define a closed flow path between the ends of the first and second thermally conductive posts such that thermal transfer fluid exiting the first spiral passage at the end of the first thermally conductive post is forced to flow through the connection channel and to enter the second spiral passage at the end of the second thermally conductive post, the connection channel being bounded on a top by the thermal transfer surface such that thermal transfer fluid in the connection channel contacts the thermal transfer surface;
   thereby forming a path for flow of said thermal transfer fluid from said inlet, through said passageway, along the length of said first spiral passage to the end of the first thermally conductive post and to said connection channel, then along said connection channel to said second spiral passage at the end of the second thermally conductive post, then along the length of said second spiral passage, and then to said outlet.

2. The thermal transfer device of claim 1, wherein said passageway is sealed.

3. The thermal transfer device of claim 1, wherein said path is essentially uninterrupted.

4. The thermal transfer device of claim 1, wherein each of said first and second thermally conductive posts is formed as a grooved rod having a central generally cylindrical post surrounded by at least one spiral groove which forms a respective one of said first and second spiral passages.

5. The thermal transfer device of claim 1, wherein each of said first and second spiral passages is bounded on the exterior thereof by a generally cylindrical wall.

6. The thermal transfer device of claim 5, wherein said generally cylindrical wall is thermally conductive and is in thermally conductive contact with said thermal transfer surface.

7. The thermal transfer device of claim 1, wherein said thermal transfer fluid flowing through said connection channel is in thermally conductive contact with said thermal transfer surface.

8. The thermal transfer device of claim 1, wherein said thermal transfer surface is a first thermal transfer surface, said connection channel is a first connection channel, and said path is a first path, and wherein said thermal transfer device further comprises:
   a second thermal transfer surface;
   third and fourth spiral passages, said third and fourth spiral passages bounded on an interior of the spirals thereof respectively by the first and second thermally conductive posts each having a second end in thermally conductive contact with the second thermal transfer surface, and bounded on an exterior of the spirals thereof by a respective wall, the third and fourth spiral passages being bounded so that thermal transfer fluid is forced to flow along a length of the third and fourth spiral passages; and
   a second connection channel connecting said third and fourth spiral passages, said second connection channel being bounded to define a closed flow path between the second ends of the first and second thermally conductive posts such that thermal transfer fluid exiting the third spiral passage at the second end of the first thermally conductive post is forced to flow through the second connection channel and to enter the fourth spiral passage at the second end of the second thermally conductive post, the second connection channel being bounded on a bottom by the second thermal transfer surface such that thermal transfer fluid in the second connection channel contacts the second thermal transfer surface;
   thereby forming a second path for flow of said thermal transfer fluid through said passageway, along the length of said third spiral passage to the second end of the first thermally conductive post and to said second connection channel, then along said second connection channel to said fourth spiral passage at the second end of the second thermally conductive post, then along the length of said fourth spiral passage.

9. A thermal transfer device comprising:

first and second thermal transfer surfaces; and a passageway for conducting a thermal transfer fluid from an inlet to an outlet while the thermal transfer fluid passes in thermal contact with said first and second thermal transfer surfaces;

said passageway including:

a first spiral passage on a first side of said passageway and having a first end formed to receive flow of said thermal transfer fluid from said passageway and a second end opposite to said first end thereof, a second spiral passage on said first side of said passageway, and having a first end formed to receive said flow of said thermal transfer fluid and a second end opposite to said first end thereof;

a first connection channel positioned to receive said thermal transfer fluid from said second end of said first spiral passage and conduct said thermal transfer fluid to said first end of said second spiral passage, thermal transfer fluid flowing through said first connection channel being in thermal contact with said first thermal transfer surface;

a third spiral passage on a second side of said passageway opposed to said first side thereof, said third spiral passage having a first end formed to receive flow of said thermal transfer fluid from said passageway and a second end opposite to said first end thereof;

a fourth spiral passage on said second side of said passageway, and having a first end formed to receive said flow of said thermal transfer fluid and a second end opposite to said first end thereof;

a second connection channel positioned to receive said thermal transfer fluid from said second end of said third spiral passage and conduct said thermal transfer fluid to said first end of said fourth spiral passage, thermal transfer fluid flowing through said second connection channel being in thermal contact with said second thermal transfer surface;

said first and second spiral passages being bounded on an interior of the spirals thereof by respective first and second thermally conductive posts each having a first end in thermally conductive contact with the first thermal transfer surface, and bounded on an exterior of the spirals thereof by a respective wall, the first and second spiral passages being bounded so that thermal transfer fluid is forced to flow along a length of the first and second spiral passages, said first connection channel being bounded to define a closed flow path between said second end of said first spiral passage and said first end of said second spiral passage such that thermal transfer fluid exiting the second end of the first spiral passage is forced to flow through the first connection channel and to enter the first end of the second spiral passage, the first connection channel being bounded on a top by the first thermal transfer surface such that thermal transfer fluid in the first connection channel contacts the first thermal transfer surface, said third and fourth spiral passages being bounded on an interior of the spirals thereof respectively by the first and second thermally conductive posts each having a second end in thermally conductive contact with the second thermal transfer surface, and bounded on an exterior of the spirals thereof by a respective wall, the third and fourth spiral passages being bounded so that thermal transfer fluid is forced to flow along a length of the third and fourth spiral passages, said second connection channel being bounded to define a closed flow path between said second end of said third spiral passage and said first end of said fourth spiral passage such that thermal transfer fluid exiting the second end of the third spiral passage is forced to flow through the second connection channel and to enter the first end of the fourth spiral passage, the second connection channel being bounded on a bottom by the second thermal transfer surface such that thermal transfer fluid in the second connection channel contacts the second thermal transfer surface, thereby forming a path for flow of said thermal transfer fluid from said inlet, through said passageway, to said first and third spiral passages, where a portion of said thermal transfer fluid flows into the first end of the first spiral passage and along said first spiral passage to the second end of the first spiral passage and into said first connection channel, then along said first connection channel and into the first end of the second spiral passage and along said second spiral passage to the second end of the second spiral passage, and then to said passageway, and a second portion of said thermal transfer fluid flows into the first end of the third spiral passage and along said third spiral passage to the second end of the third spiral passage and into said second connection channel, then along said second connection channel and into the first end of the fourth spiral passage and along said fourth spiral passage to the second end of the fourth spiral passage, and then to said passageway, after which said first and second portions of said thermal transfer fluid combine and flow to said outlet;

whereby said flow of said thermal transfer fluid provides heat transfer to each of said first and second thermal transfer surfaces.

10. The thermal transfer device of claim 9, further comprising a plurality of pairs of said first and second spiral passages and said third and fourth spiral passages.

11. The thermal transfer device of claim 9, wherein said first and third spiral passages extend in a direction transverse to a direction of flow of said thermal transfer fluid along said passageway entering said first and third spiral passages.

12. The thermal transfer device of claim 11, wherein the respective walls that bound the exterior of said first and third spiral passages is in thermally conductive contact with said first thermal transfer surface.

13. The thermal transfer device of claim 9, wherein said first and second thermally conductive posts are each formed as a threaded rod having a central generally cylindrical post surrounded by at least one spiral groove which respectively forms said first and third spiral passages and said second and fourth spiral passages.

14. The thermal transfer device of claim 13, wherein said threaded rods are positioned so that said first and second spiral passages are on a first side of said passageway and said third and fourth spiral passages are on a second side of said passageway opposite to said first side of said passageway.

15. The thermal transfer device of claim 9, wherein said first and third spiral passages are bounded on the exterior thereof by a first generally cylindrical wall, and said second and fourth spiral passages are bounded on the exterior thereof by a second generally cylindrical wall.

16. The thermal transfer device of claim 15, wherein said first and second generally cylindrical walls are thermally conductive and are in thermally conductive contact with said first and second thermal transfer surfaces.

17. The thermal transfer device of claim 15, wherein said first and second generally cylindrical walls are substantially co-axial.

18. The thermal transfer device of claim 9, further comprising:
respective pluralities of first, second, third and fourth spiral passages, connected in pairs by respective pluralities of first and second connection channels and arranged to provide thermal transfer with said first and second thermal transfer surfaces.

19. A thermal transfer system comprising:
a first thermal transfer surface;
a first thermally conductive layer in thermal contact with said first thermal transfer surface, said first thermally conductive layer including a plurality of first connecting channels therein,
a first support layer on a side of the first thermally conductive layer opposite the first thermal transfer surface and having a first plurality of holes extending therethrough;
a central layer for providing a flow of a thermal transfer fluid from an inlet to an outlet, the central layer on a side of the first support layer opposite the first thermally conductive layer;
a second support layer on a side of the central layer opposite the first support layer and having a second plurality of holes extending therethrough, said second plurality of holes being aligned with said first plurality of holes,
a second thermally conductive layer on a side of the second support layer opposite the central layer and including a plurality of second connecting channels therein,
a second thermal transfer surface in thermal contact with said second thermally conductive layer;
a plurality of grooved rods, each of said plurality of grooved rods having a central post and being disposed in a respective one of said first and second plurality of holes and in thermal contact with said first and second thermal transfer surfaces at first and second ends of the central post, respectively, each of the plurality of grooved rods extending from one of said first connecting channels through said respective one of said first plurality of holes, through said central layer and through a respective one of said second plurality of holes to one of said second connecting channels;
wherein exteriors of each of said plurality of grooved rods cooperates with interiors of said respective ones of said first and second plurality of holes to form a pair of opposed spiral passages between the exteriors of said plurality of grooved rods and the interiors of said respective ones of said first and second plurality of holes for permitting said flow of said thermal transfer fluid therethrough, each of the opposed spiral passages being bounded on an interior of the spirals thereof by a respective central post and bounded on an exterior of the spirals thereof by a respective one of the first and second plurality of holes so that thermal transfer fluid is forced to flow along a length of the opposed spiral passages,
said first and second connection channels each being bounded to define a closed flow path between ends of a respective pair of spiral passages such that thermal transfer fluid exiting an end of a spiral passage adjacent a corresponding thermal transfer surface is forced to flow through the connection channel and to enter an end of another spiral passage adjacent the corresponding thermal transfer surface, the first and second connection channels each being bounded on a corresponding thermal transfer surface such that thermal transfer fluid in the connection channel contacts the corresponding thermal transfer surface,
whereby a passageway is provided for flow of said thermal transfer fluid beginning at said inlet, along said central layer to said plurality of grooved rods, then to divide and flow along said opposed spiral passages to said first and second connecting channels, respectively, and then along another of said opposed spiral passages to said outlet.

20. The thermal transfer system of claim 19, wherein at least one of said first and second thermal transfer surfaces is generally planar.

21. The thermal transfer system of claim 19, wherein said grooved rods are positioned transverse to said central layer.

22. The thermal transfer system of claim 21, wherein said grooved rods are generally perpendicular to said central layer.

23. The thermal transfer system of claim 19, wherein at least one of said first and second connection channels does not extend completely through a respective one of the first and second thermally conductive layers.

* * * * *